United States Patent
Kushihara et al.

(10) Patent No.: US 10,084,472 B1
(45) Date of Patent: Sep. 25, 2018

(54) PHASE MODULATION-TYPE REDUNDANT TWO-PHASE-OUTPUT RESOLVER AND SIGNAL OUTPUT METHOD THEREOF

(71) Applicant: TAMAGAWA SEIKI CO., LTD., Nagano-ken (JP)

(72) Inventors: Hiroshi Kushihara, Nagano-ken (JP); Kazuyuki Ishibashi, Nagano-ken (JP); Hirofumi Maruyama, Nagano-ken (JP); Katsutoshi Toyotake, Nagano-ken (JP); Shinichi Arai, Nagano-ken (JP); Toshiki Muramatsu, Nagano-ken (JP)

(73) Assignee: TAMAGAWA SEIKI CO., LTD., Nagano-Ken (JP)

( * ) Notice: Subject to any disclaimer, the term of this patent is extended or adjusted under 35 U.S.C. 154(b) by 0 days.

(21) Appl. No.: 15/909,248

(22) Filed: Mar. 1, 2018

(51) Int. Cl.
| | |
|---|---|
| *H03M 1/48* | (2006.01) |
| *H02K 24/00* | (2006.01) |
| *G01P 3/44* | (2006.01) |
| *H02P 6/16* | (2016.01) |
| *G01D 5/20* | (2006.01) |
| *G01R 31/28* | (2006.01) |
| *G01D 5/244* | (2006.01) |

(52) U.S. Cl.
CPC ............... *H03M 1/485* (2013.01); *G01P 3/44* (2013.01); *H02K 24/00* (2013.01); *H02P 6/16* (2013.01); *G01D 5/2046* (2013.01); *G01D 5/2073* (2013.01); *G01D 5/2448* (2013.01); *G01D 5/24457* (2013.01); *G01R 31/2829* (2013.01)

(58) Field of Classification Search
CPC ............. G01D 5/24457; G01D 5/2448; G01D 5/2046; G01D 5/2073; G01R 31/2829; H03M 1/645
USPC ......................................................... 341/116
See application file for complete search history.

(56) References Cited

U.S. PATENT DOCUMENTS 7,088,025 B2 * 8/2006 Kujirai ................. G01D 5/2046
310/168
9,297,672 B2 * 3/2016 Kim ..................... G01D 5/2448

* cited by examiner

*Primary Examiner* — Khai M Nguyen
(74) *Attorney, Agent, or Firm* — Wenderoth, Lind & Ponack, L.L.P.

(57) ABSTRACT

The present invention relates to a phase modulation-type redundant two-phase-output resolver, an excitation signal (100) is applied to an excitation winding (50) of an annular stator (21) having a VR-type rotor (20) disposed therein, and a two-phase output signal (101) is outputted from first and second output windings (43, 44) that are provided in the annular stator (21), the excitation winding (50) is made up of first and second excitation windings (40, 41) of mutually different phases, and the excitation signal (100) has two phases, and even in a case where a break occurs in only any one winding from among the first and second excitation windings (40, 41) and the first and second output windings (43, 44), at least a one-phase output signal can be obtained.

6 Claims, 5 Drawing Sheets

(PRIOR ART)

PHASE MODULATION-TYPE REDUNDANT TWO-PHASE-OUTPUT RESOLVER AND SIGNAL OUTPUT METHOD THEREOF

BACKGROUND OF THE INVENTION

1. Field of the Invention

The present invention relates to a phase modulation-type redundant two-phase-output resolver and to a signal output method thereof, and in particular, to a novel improvement for enabling a redundant system to be maintained, by configuring the resolver as a resolver with two-phase excitation/two-phase output.

2. Description of the Related Art

Resolvers of this type conventionally used may have various configurations, as represented by a "resolver" of Japanese Patent Application Publication No. 2007-327868 and a "redundant angle detection structure" of Japanese Patent Application Publication No. 2009-133647.

First, as illustrated in FIG. 3, FIG. 4 and FIG. 5, in the configuration of the "resolver" of Japanese Patent Application Publication No. 2007-327868, the resolver is provided with: a stator core 21 in which in a circumferential direction thereof teeth 30 are formed at intervals; one-phase excitation windings 40, 41 and two-phase output windings configured by winding of conducting wires around respective teeth 30; and a rotor (corresponding to a VR-type rotor 20 of FIG. 4) provided so as to be rotatable about the stator core 21 and having an outer circumference curve in which gap permeance with respect to the stator core 21 varies sinusoidally in accordance with a rotation angle, with changes in gap permeance in conjunction with the rotation of the rotor being detected as output voltages from the output windings, and with the rotation angle of the rotor being detected on the basis of the output voltages, wherein two sets of excitation windings 40, 41, to which excitation voltages are applied respectively, are built in the stator core 21.

The excitation windings of the resolver of a known amplitude modulation scheme, as illustrated in FIG. 4, are made up of an excitation winding 50 having a two-winding set of a first excitation winding 40 and a second excitation winding 41 of one phase, and a first output winding 43 and a second output winding 44 of two phases. As illustrated in FIG. 3, the first excitation winding 40 and the second excitation winding 41 are fitted to the stator core 21, with the first output winding 43 and the second output winding 44 being fitted thereafter.

Therefore, the first excitation winding 40 is disposed on a side further toward the outer-diameter of the teeth 30 than a partition wall 42 as a boundary that is formed at an insulator 34 provided in the stator core.

The second excitation winding 41 is disposed on a side further toward the inner-diameter of the teeth 30 than the partition wall 42 as a boundary.

The excitation windings 40, 41 have an identical number of turns but are not interconnected, and accordingly the windings are provided independently from each other, each having one phase, as excitation windings 40, 41 that make up respective one-phase redundant systems.

In the configuration of FIG. 4, therefore, output signals S cos and S sin of two phases can be obtained as illustrated in FIG. 5 from the first output winding 43 and second output winding 44, by rotation of the VR-type rotor 20.

The redundancy-type angle detection structure of Japanese Patent Application Publication No. 2009-133647 described above is configured using two resolvers (not shown) that are disposed in parallel or in series.

The conventional configuration illustrated in FIG. 2 is a configuration of a known non-redundant resolver relying on a known amplitude modulation scheme, which has been mainstream in conventional art. In this configuration one-phase excitation yields a two-phase output.

Specifically, the excitation winding 50 is made up of one first excitation winding 40 alone, and a VR-type rotor 20, having no winding, is rotatably disposed inside an annular stator 21.

Output windings 60 corresponding to the first excitation winding 40 are formed by first and second output windings 43, 44 that make up a two-phase output.

In the conventional configuration of FIG. 2, therefore, first and second output voltages $E_{S1-S3}$, $E_{S2-S4}$ for two phases according to an amplitude modulation scheme can be obtained on the basis of known output voltage equations below.

Specifically, the output voltage equation of one-phase input/two-phase output in the configuration of FIG. 4 is as given below.

Output Voltage Equation

| | |
|---|---|
| $ER1\text{-}R2 = E \sin \omega t$ | Excitation voltage |
| $ES1\text{-}S3 = kER1\text{-}R2 \cos N\theta$ | First output voltage |
| $ES2\text{-}S4 = kER1\text{-}R2 \sin N\theta$ | Second output voltage |

E: voltage
$\omega$: excitation frequency (angular velocity)
t: time
k: voltage transformation ratio
N: multiplication factor
$\theta$: rotation angle

SUMMARY OF THE INVENTION

Conventional resolvers have the following problems that arise from the above configurations.

In the resolver of Japanese Patent Application Publication No. 2007-327868 described above, a pair of first and second excitation windings 40, 41 is provided as the excitation winding 50, as illustrated in FIG. 3 to FIG. 5, but only a redundant system of one-phase excitation is configured.

In the resolver of Japanese Patent Application Publication No. 2009-133647, the resolvers in the pair thereof are disposed in parallel or in series. Accordingly, the overall shape of the redundant resolver is large, which runs counter to the trend of requiring smaller sizes.

In the conventional configuration of FIG. 2, the excitation side includes the excitation winding 50 of one phase alone, and accordingly the resolver itself becomes non-functional upon occurrence of a break in the excitation winding 50.

To solve such problems, an object of the present invention is to provide a phase modulation-type redundant two-phase-output resolver, and a signal output method of the resolver, that allow maintaining a redundant system even in a case where a break occurs in only any one of respective windings on the excitation side and the output side, in particular by configuring the resolver as a resolver with two-phase excitation/two-phase output.

The phase modulation-type redundant two-phase-output resolver according to the present invention is a two-phase output-type resolver in which an excitation signal is applied to an excitation winding of an annular stator having a VR-type rotor disposed therein, and a two-phase output signal is outputted from first and second output windings that are provided in the annular stator, wherein the excitation winding is made up of first and second excitation windings of mutually different phases, and the excitation signal has two phases; even in a case where a break occurs in only any one winding from among the first and second excitation windings and the first and second output windings, at least a one-phase output signal can be obtained; in a case where a break occurs in any one of the first and second output windings, a one-phase output signal can be obtained from the other one of the first output winding or the second output winding; and in a case where a break occurs in any one of the first and second excitation windings, a two-phase output signal can be obtained from the first and second output windings. The signal output method in a phase modulation-type redundant two-phase-output resolver of the present invention is a signal output method in a two-phase output-type resolver in which an excitation signal is applied to an excitation winding of an annular stator having a VR-type rotor disposed therein, and a two-phase output signal is outputted from first and second output windings that are provided in the annular stator, with the excitation winding being made up of first and second excitation windings of mutually different phases, and the excitation signal including two phases, the method including, even in a case where a break occurs in only any one winding from among the first and second excitation windings and the first and second output windings, at least a one-phase output signal can be obtained; in a case where a break occurs in any one of the first and second output windings, a one-phase output signal can be obtained from the other one of the first output winding and the second output winding; and in a case where a break occurs in any one of the first and second excitation windings, a two-phase output signal can be obtained from the first and second output windings.

Due to the above features, the phase modulation-type redundant two-phase-output resolver and signal output method thereof according to the present invention elicit effects such as the following:

Specifically, a two-phase output-type resolver and a signal output method thereof, in which an excitation signal is applied to an excitation winding of an annular stator having a VR-type rotor disposed therein, and a two-phase output signal is outputted from first and second output windings that are provided in the annular stator, involve a configuration and a method, wherein the excitation winding is made up of first and second excitation windings of mutually different phases, and the excitation signal has two phases, such that even in a case where a break occurs in only any one winding from among the first and second excitation windings and the first and second output windings, at least a one-phase output signal can be obtained. As a result, it becomes possible to obtain a resolver output and to increase significantly the reliability of the resolver even in the case where a wire break occurs in the excitation system or the output system.

Improvements in reliability are also achieved in a case where a break occurs in any one of the first and second output windings, a one-phase output signal can be obtained from the other first output winding or second output winding.

Further, in a case where a break occurs in any one of the first and second excitation windings, a two-phase output signal can be obtained from the first and second output windings. As a result it becomes possible to obtain a resolver output similar to that of conventional resolvers, and to achieve a redundant system.

DESCRIPTION OF THE PREFERRED EMBODIMENTS

The phase modulation-type redundant two-phase-output resolver and the signal output method thereof according to the present invention allow maintaining a redundant system by configuring a resolver with two-phase excitation/two-phase output.

EXAMPLE

Preferred embodiments of the phase modulation-type redundant two-phase-output resolver and signal output method thereof according to the present invention will be explained next with reference to accompanying drawings.

In the explanation, portions identical or similar to those of the conventional example will be denoted by the same reference symbols and numerals.

Figure 1:
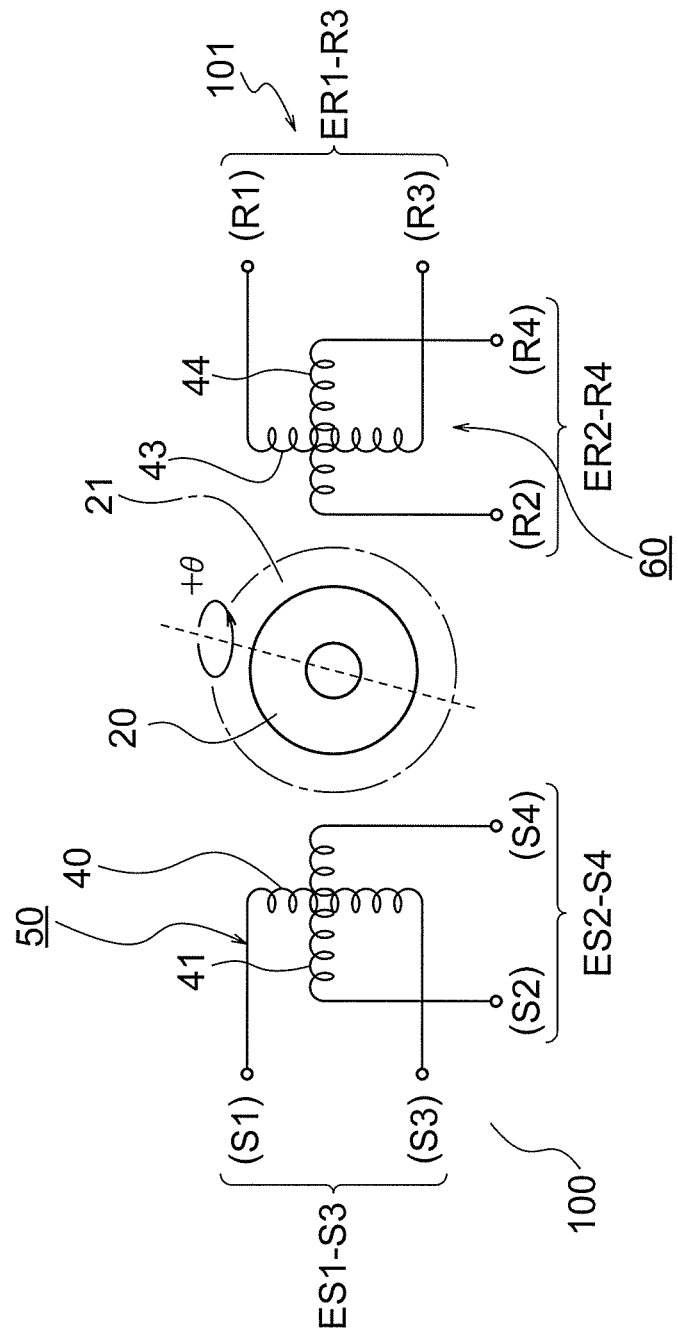
FIG. 1 is a wiring diagram illustrating a phase modulation-type redundant two-phase-output resolver according to the present invention.
Figure 2:
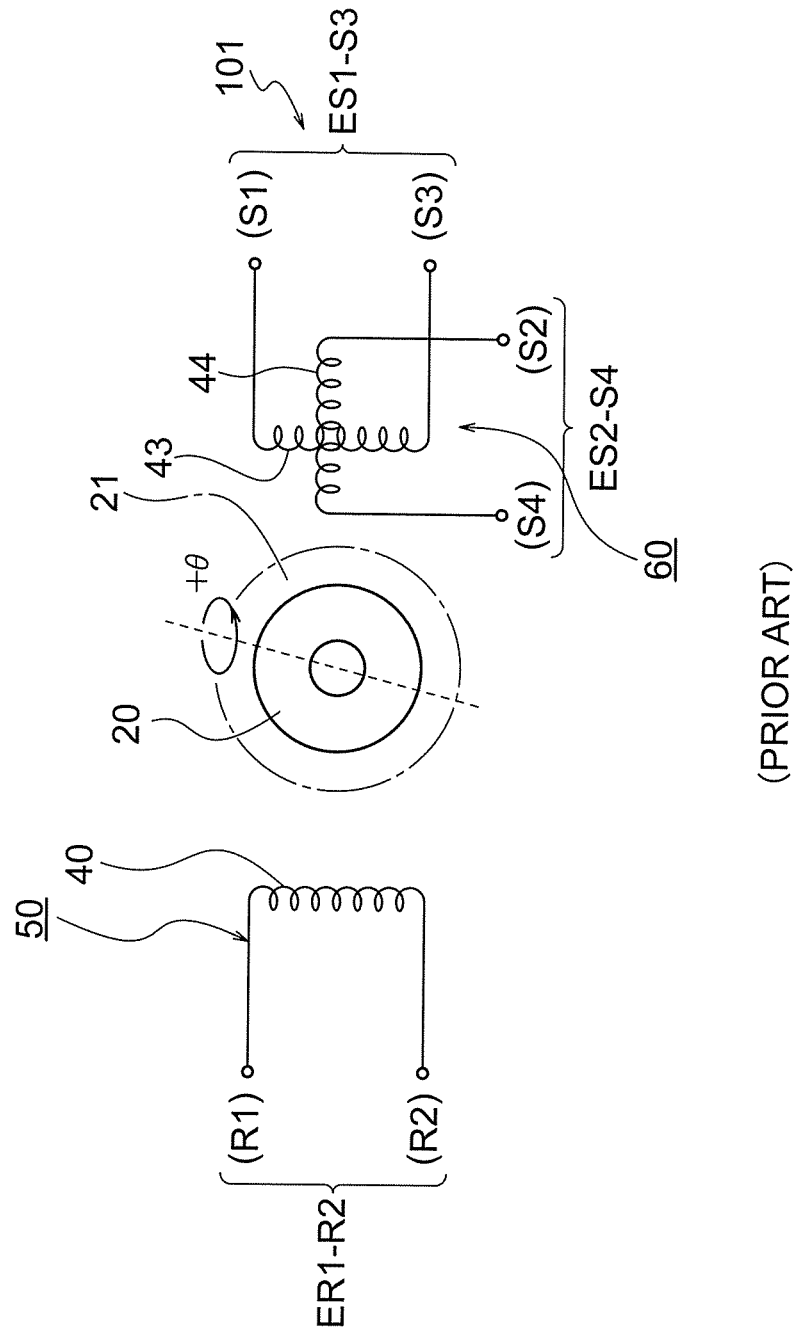
FIG. 2 is a wiring diagram illustrating a conventional amplitude modulation-type resolver.
Figure 3:
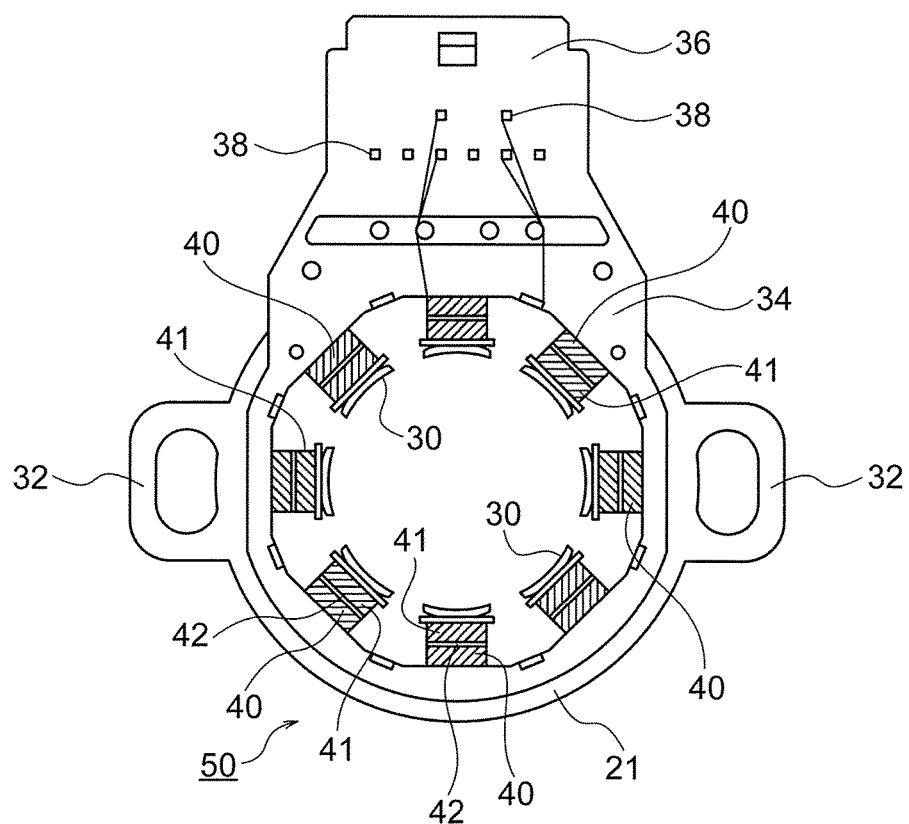
FIG. 3 is a planar configuration diagram of a conventional resolver having redundant excitation windings.
Figure 4:
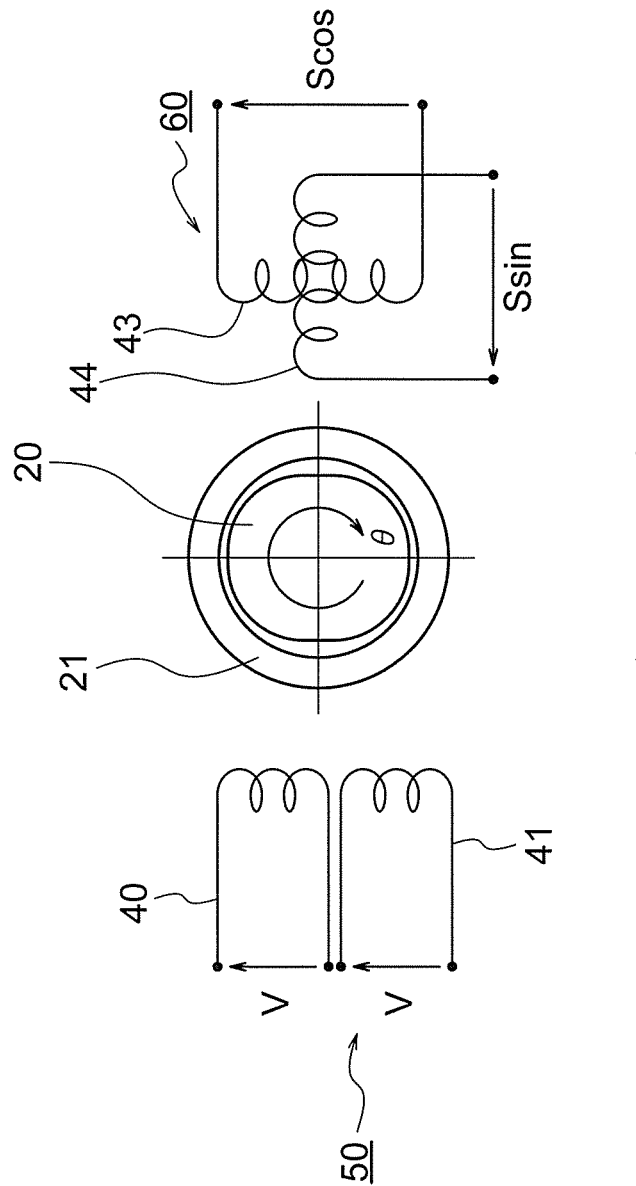
FIG. 4 is a wiring diagram of the resolver of FIG. 3.
Figure 5:
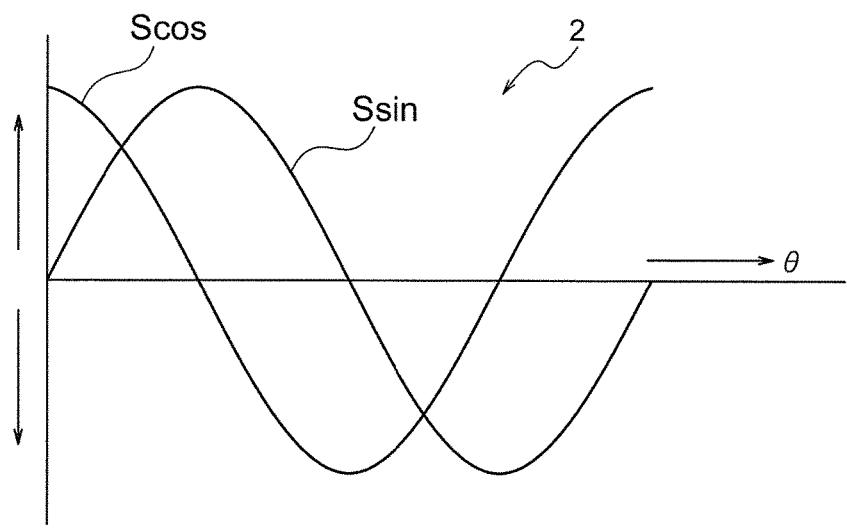
FIG. 5 is a waveform diagram illustrating two-phase output signals from the output windings 60 of FIG. 4.

In FIG. 1, a VR-type rotor denoted by the reference numeral 20 is axially supported so as to be rotatable inside an annular stator 21. An excitation winding 50 of two phases for applying an excitation signal 100 and an output winding 60 of two phases for obtaining an output signal 101 are provided in each magnetic pole (not shown) of the annular stator 21.

The excitation winding 50 is made up of first and second excitation windings 40, 41 disposed for two phases that differ from each other by a 90-degree phase, such that a first excitation voltage ES1-S3 is inputted to input terminals at both ends of the first excitation winding 40.

A second excitation voltage ES2-ES4 is inputted to input terminals on both ends of the second excitation winding 41.

The output winding 60 is made up of first and second output windings 43, 44 disposed for two phases that differ from each other by a 90-degree phase, such that a first output voltage ER1-R3 is outputted from output terminals on both ends of the first output winding 43.

A second output voltage ER2-R4 is outputted from output terminals on both ends of the second output winding 44.

A state for obtaining a two-phase output in the phase modulation-type redundant two-phase-output resolver of FIG. 1 according to the present invention, described above, will be explained by the following output voltage equation.

Specifically, the output voltage equation of two-phase input/two-phase output in the configuration of FIG. 1 is as given below.

Output Voltage Equation $ES1\text{-}S3 = E \sin \omega t$         First excitation voltage $ES2\text{-}S4 = E \cos \omega t$         Second excitation voltage $ER1\text{-}R3 = kES1\text{-}S3\cos N\theta - kES2\text{-}S4\sin N\theta$ $= kE\sin\omega t\cdot\cos N\theta - kE\cos\omega t\cdot\sin N\theta$ $= kE\sin(\omega t - N\theta)$   First output voltage $ER2\text{-}R4 = kES1\text{-}S3\cos N\theta + kES2\text{-}S4\sin N\theta$ $= kE\sin\omega t\cdot\cos N\theta + kE\cos\omega t\cdot\sin N\theta$ $= kE\cos(\omega t - N\theta)$   Second output voltage Therefore, by inputting to the excitation winding 50 the first and second excitation voltages—an excitation signal of two phases, it becomes possible to obtain the first and second output voltages—a two-phase output signal from the output windings 60—on the basis of the output voltage equation described above.

Since an angle signal can be outputted for each of the first and second output voltages ER1-R3, ER2-R4, in the circuit diagram of FIG. 1 and the output voltage equation described above, even in a case where a break occurs in any one of the first and second output voltages ER1-R3, ER2-R4, still the angle can be detected from the other one from among the first and second output voltages ER1-R3, ER2-R4.

In a case of 0 (zero) excitation voltage due to occurrence of a breakage in any one of the first and second excitation voltages ES1-S3, ES2-S4 described above, since any of the first and second output voltages ER1-R3, ER2-R4 is 0 (zero), angle detection is still possible in the same way as in a conventional amplitude modulation scheme with one-phase input/two-phase output.

In the circuit diagram of FIG. 1, therefore, angle detection is possible also in a case where a break occurs in windings 40, 41, 43, 44 each having one phase alone of any one of the excitation winding 50 and the output windings 60. Accordingly, the circuit diagram of FIG. 1 can be regarded as having a redundant system.

The phase modulation-type redundant two-phase-output resolver and signal output method thereof according to the present invention are as follows.

In a two-phase output-type resolver in which an excitation signal 100 is applied to an excitation winding 50 of an annular stator 21 having a VR-type rotor 20 disposed therein, and a two-phase output signal 101 is outputted from first and second output windings 43, 44 that are provided in the annular stator 21, with the excitation winding 50 being made up of first and second excitation windings 40, 41 of mutually different phases, and the excitation signal 100 including two phases, provided are: a configuration and a method are provided in which even in a case where a break occurs in only any one winding from among the first and second excitation windings 40, 41 and the first and second output windings 43, 44, at least a one-phase output signal 101 can be obtained; a configuration and a method in which in a case where a break occurs in any one of the first and second output windings 43, 44, a one-phase output signal 101 can be obtained from the other first output winding 43 or second output winding 44; and a configuration and a method in which in a case where a break occurs in any one of the first and second excitation windings 40, 41, a two-phase output signal 101 can be obtained from the first and second output windings 43, 44.

The phase modulation-type redundant two-phase-output resolver and signal output method thereof according to the present invention allow at least a one-phase output signal to be obtained even in a case where a break occurs in only any one winding from among excitation windings and output windings, whereby, a highly reliable redundant system can be obtained.

What is claimed is:

1. A phase modulation-type redundant two-phase-output resolver in which an excitation signal (100) is applied to an excitation winding (50) of an annular stator (21) having a VR-type rotor (20) disposed therein, and a two-phase output signal (101) is outputted from first and second output windings (43, 44) that are provided in the annular stator (21), wherein
   the excitation winding (50) is made up of first and second excitation windings (40, 41) of mutually different phases, and the excitation signal (100) has two phases, and
   even in a case where a break occurs in only any one winding from among the first and second excitation windings (40, 41) and the first and second output windings (43, 44), at least a one-phase output signal can be obtained.

2. The phase modulation-type redundant two-phase-output resolver of claim 1, wherein in a case where a break occurs in any one of the first and second output windings (43, 44), a one-phase output signal (101) can be obtained from the other one of the first output winding (43) and the second output winding (44).

3. The phase modulation-type redundant two-phase-output resolver of claim 1, wherein in a case where a break occurs in any one of the first and second excitation windings (40, 41), a two-phase output signal can be obtained from the first and second output windings (43, 44).

4. A signal output method in a phase modulation-type redundant two-phase-output resolver, in which an excitation signal (100) is applied to an excitation winding (50) of an annular stator (21) having a VR-type rotor (20) disposed therein, and a two-phase output signal (101) is outputted from first and second output windings (43, 44) that are provided in the annular stator (21), with the excitation winding (50) being made up of first and second excitation windings (40, 41) of mutually different phases, and the excitation signal (100) including two phases,
   the method comprising, even in a case where a break occurs in only any one winding from among the first and second excitation windings (40, 41) and the first and second output windings (43, 44), at least a one-phase output signal can be obtained.

5. The signal output method in a phase modulation-type redundant two-phase-output resolver of claim 4, wherein in a case where a break occurs in any one of the first and second output windings (43, 44), a one-phase output signal (101) can be obtained from the other one of the first output winding (43) and the second output winding (44).

6. The signal output method in a phase modulation-type redundant two-phase-output resolver of claim 4, wherein in a case where a break occurs in any one of the first and second excitation windings (40, 41), a two-phase output signal (101) can be obtained from the first and second output windings (43, 44).

* * * * *